(12) United States Patent
Otsuka et al.

(10) Patent No.: US 9,866,219 B2
(45) Date of Patent: Jan. 9, 2018

(54) DEVICE FOR LOGIC OPERATION

(71) Applicants: Meisei Gakuen, Hino-shi (JP); BUFFALO MEMORY CO., LTD., Nagoya-shi (JP)

(72) Inventors: Kanji Otsuka, Hino (JP); Yoichi Sato, Hino (JP); Takayuki Okinaga, Nagoya (JP); Shuichiro Azuma, Nagoya (JP)

(73) Assignees: MEISEI GAKUEN, Hino-shi (JP); BUFFALO MEMORY CO., LTD., Nagoya-shi (JP)

( * ) Notice: Subject to any disclaimer, the term of this patent is extended or adjusted under 35 U.S.C. 154(b) by 0 days.

(21) Appl. No.: 14/908,339

(22) PCT Filed: Jun. 9, 2014

(86) PCT No.: PCT/JP2014/065245
§ 371 (c)(1),
(2) Date: Jan. 28, 2016

(87) PCT Pub. No.: WO2015/015905
PCT Pub. Date: Feb. 5, 2015

(65) Prior Publication Data
US 2016/0211851 A1    Jul. 21, 2016

(30) Foreign Application Priority Data
Jul. 29, 2013   (JP) .................................. 2013-157090

(51) Int. Cl.
H03K 19/17 (2006.01)
H03K 19/21 (2006.01)
G06F 1/02 (2006.01)

(52) U.S. Cl.
CPC ............... *H03K 19/21* (2013.01); *G06F 1/02* (2013.01)

(58) Field of Classification Search
USPC .............................................. 326/39, 40, 41
See application file for complete search history.

(56) References Cited

U.S. PATENT DOCUMENTS

| 6,181,164 B1 | 1/2001 | Miller |
| 6,340,897 B1 * | 1/2002 | Lytle .................... H03K 19/177 326/39 |

(Continued)

FOREIGN PATENT DOCUMENTS

| JP | H02-236637 A | 9/1990 |
| JP | 4-57112 A | 2/1992 |

(Continued)

OTHER PUBLICATIONS

Taiwanese Office Action issued Mar. 25, 2016 in Patent Application No. 103119252 (with English and Japanese Translation).

(Continued)

*Primary Examiner* — Douglas W Owens
*Assistant Examiner* — Jianzi Chen
(74) *Attorney, Agent, or Firm* — Oblon, McClelland, Maier & Neustadt, L.L.P.

(57) ABSTRACT

An arithmetic logic operation device including a memory device configured to store a lookup table and receive an input of a bit string N bits long, N being an integer of at least 2, the input bit string representing an address in the lookup table at which is stored multiple-bit data of which a part includes a bit representative of the result of a logical operation performed between the bits included in the input bit string. The memory device is accessed to output the bits included in the data stored at the address represented by the received bit string. The arithmetic logic device achieves arithmetic processing in a relatively short time on a relatively small circuit scale.

8 Claims, 9 Drawing Sheets

(56) References Cited

U.S. PATENT DOCUMENTS

| | | | |
|---|---|---|---|
| 6,487,190 B1* | 11/2002 | Regis | H03H 17/0226 |
| | | | 370/342 |
| 7,111,224 B1 | 9/2006 | Trimberger | |
| 7,157,933 B1* | 1/2007 | Schmit | H03K 19/17776 |
| | | | 326/38 |
| 7,768,430 B1 | 8/2010 | Pan et al. | |
| 2003/0068038 A1 | 4/2003 | Hanounik | |
| 2010/0179976 A1 | 7/2010 | Ishizaki et al. | |
| 2012/0262201 A1* | 10/2012 | Redgrave | H03K 19/1776 |
| | | | 326/39 |

FOREIGN PATENT DOCUMENTS

| | | |
|---|---|---|
| JP | 9-292990 A | 11/1997 |
| JP | 2003-281516 A | 10/2003 |
| JP | 2008-124843 A | 5/2008 |
| JP | 2010-165179 A | 7/2010 |

OTHER PUBLICATIONS

Inet: "74LVC1G386 3-input Exclusive-OR gate," [online], Sep. 3, 2007, [searched on Jul. 16, 2013], Internet <URL: http://www.jp.nxp.com/document/data_sheet/74LVC1G386.pdf> , (12 Pages).
International Search Report dated Sep. 9, 2014 in PCT/JP2014/065245 filed Jun. 9, 2014.
Extended European Search Report dated Mar. 20, 2017 in Patent Application No. 14831256.4.
Notification of Reasons for Refusal issued in Japanese Application No. 2013-157090 dated May 9, 2017 (drafted Apr. 24, 2017).

* cited by examiner

FIG.2

| ADDRESS | DATA |
|---|---|
| 00000000 | 0xxxxxxx |
| 00000001 | 1xxxxxxx |
| ⋮ | ⋮ |
| 11111111 | 0xxxxxxx |

FIG.3

| ADDRESS | DATA |
|---|---|
| 00000000 | 01xxxxxx |
| 00000001 | 10xxxxxx |
| ⋮ | ⋮ |
| 11111111 | 01xxxxxx |

| ADDRESS | DATA |
|---|---|
| 00000000 | 01010101 |
| 00000001 | 10101010 |
| ⋮ | ⋮ |
| 11111111 | 01010101 |

DEVICE FOR LOGIC OPERATION

TECHNICAL FIELD

The present disclosure relates to a logic operation device that performs logical operations between bits included in input bit strings.

BACKGROUND ART

Along with further advances and growth in information processing technology and information communication technology has come the need for processing more and more information faster than before. In recent years, for example, the process of error correction in information processing has been required to handle data of longer bit lengths than ever before.

Such error correction requires performing the exclusive-OR (XOR or EOR) operation between the bits that are inputted typically for parity check. Logic operation devices for performing the exclusive-OR operation on the data of long bit lengths have been formed traditionally by combining 2-input XOR circuits. For example, FIG. 11 shows a typical logic operation device that performs the exclusive-OR operation on 32-bit-long data.

As shown in FIG. 11, this logic operation device for performing the exclusive-OR operation on 32-bit-long data has four 8-input XOR circuits 100 and three 2-input XOR circuits 200. Each 8-input XOR circuit 100 has seven 2-input XOR circuits 200 inside.

An example of the multiple-input (3-input) XOR gate is disclosed in NPL 1.

CITATION LIST

Non Patent Literature

[NPL 1]
inet: "74LVC1G386 3-input EXCLUSIVE-OR gate," [online], Sep. 3, 2007, [searched on Jul. 16, 2013], Internet <URL:http://www.jp.nxp.com/documents/data_sheet/74LVC1G386.pdf>

SUMMARY

Technical Problems

However, in recent years, there has been a growing demand for processing multiple-bit data. Some combinations of 2-input XOR circuits can require an inordinately large scale of circuitry. Furthermore, implementing a multi-gate structure can lead to prolonging the time of logic processing.

The present disclosure has been made in view of the above circumstances. An object of the disclosure is to provide a logic operation device that performs logic processing on multiple-bit data in a relatively short time on a relatively small circuit scale.

Solution to Problems

The above problems are solved, according to an embodiment of the present disclosure, by providing a logic operation device comprising: a memory device configured to receive an input of a N-bit long bit string and to store a lookup table, N being an integer of at least 2, the lookup table storing multiple-bit long data in an address represented by the input bit string, and a bit representative of a result of a logical operation performed between the bits included in the input bit string being stored in a part of the multiple-bit long data; and an output means configured to access the memory device and outputs the bits included in the data stored at the address represented by the received bit string.

Advantageous Effect of Disclosure

The present disclosure achieves arithmetic processing in a relatively short time on a relatively small circuit scale.

BRIEF DESCRIPTION OF DRAWINGS

FIG. 2 is an explanatory diagram showing an example of the content of a lookup table as part of a logic operation device embodying the present disclosure.

FIG. 3 is an explanatory diagram showing another example of the content of the lookup table as part of a logic operation device embodying the present disclosure.

DESCRIPTION OF EMBODIMENTS

Figure 1:
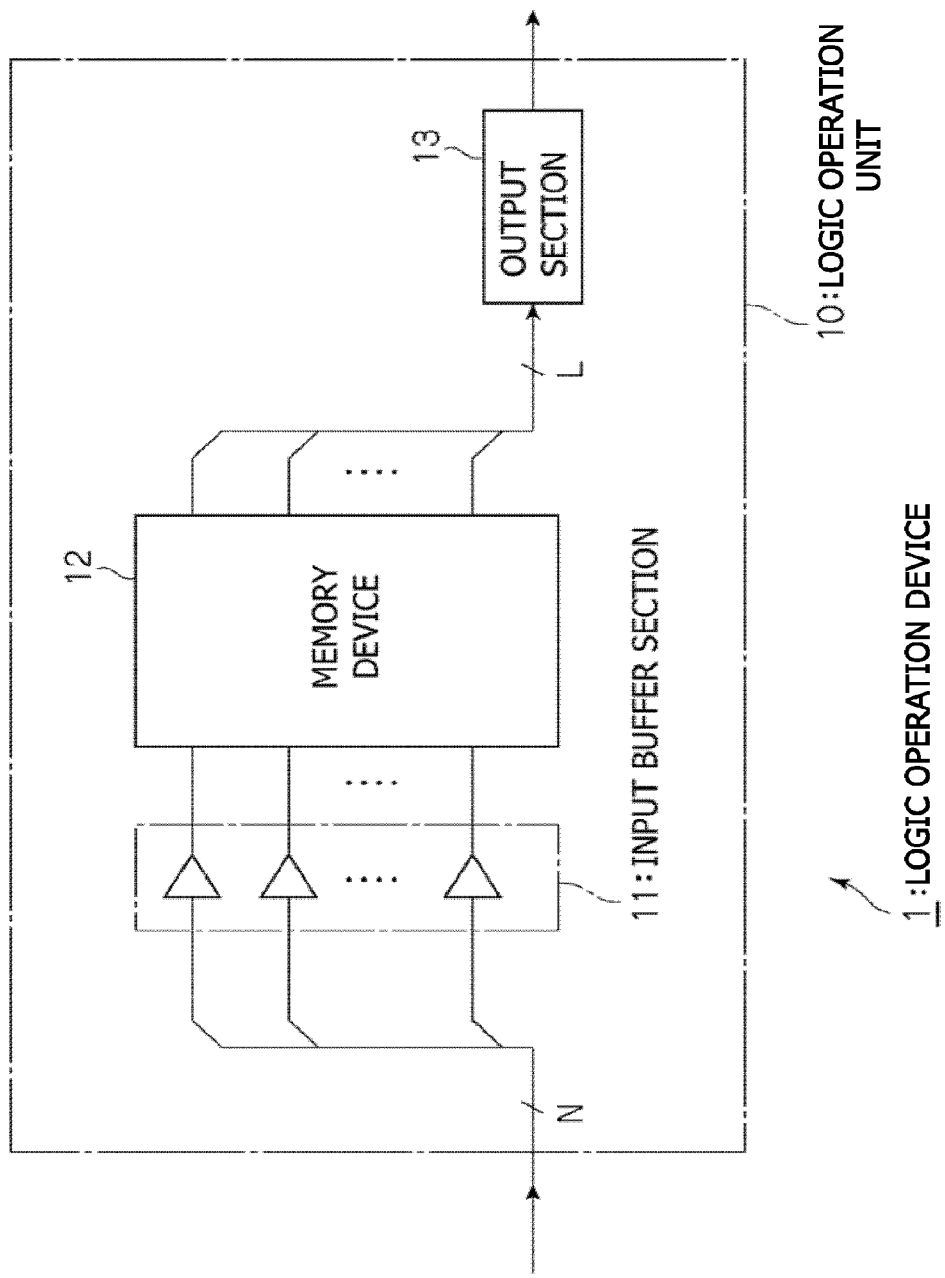
FIG. 1 is a block diagram showing a typical structure of a logic operation device as an embodiment of the present disclosure.

Some embodiments of the present disclosure are explained below with reference to the accompanying drawings. A logic operation device 1 according to one embodiment of the present disclosure includes at least one logic operation unit 10, as shown in FIG. 1. The logic operation unit 10 is basically structured to include an input buffer section 11, a memory device 12, and an output section 13.

The input buffer section 11 receives a bit string N bits long (N is an integer of at least 2) and supplies a signal represented by the bit string onto the address bus of the memory device 12. That is, the number N in this example also denotes the address bus width of the memory device 12.

The memory device 12 is specifically a nonvolatile memory or a semiconductor memory such as a static random access memory (SRAM) having as many memory cells as 2N bits×L bits (L is an integer of at least 2). The memory device 12 stores a lookup table in which multiple-bit data of which a part includes a bit representative of the result of a logical operation performed between the bits included in a bit string inputted through the input buffer section 11 is stored at an address represented by the inputted bit string. In the following examples, it is assumed for the purpose of explanation that each address location stores data of 8 (L=8) bits.

Specifically in the lookup table, as shown in FIG. 2, at the address represented by an 8-bit (N=8) string "00000000," there is stored data "0XXXXXXX" (X may be indeterminate) of which the most significant bit (MSB) is "0" indicating the result of the exclusive-OR operation performed on the bit string "00000000." At the address represented by a bit string "00000001," there is stored data "1XXXXXXX" (X may be indeterminate) of which the most significant bit (MSB) is "1" indicating the result of the exclusive-OR operation performed on the bit string "00000001."

The output section 13 reads from the data in the memory device 12 the data stored at the address represented by the bit string outputted from the input buffer section 11. The output section 13 selectively outputs from the retrieved data the bit corresponding to the result of the above-mentioned logical operation. In the above example according to the embodiment, the MSB includes the result of the logical operation. The output section 13 thus reads from the data in the memory device the data stored at the address represented by the bit string outputted from the input buffer section 11, and outputs the MSB from the retrieved data.

In another example according to the embodiment, the memory device 12 stores a lookup table in which, at the address represented by the bit string input from the inputted buffer section 11, there is stored multiple-bit data of which one bit indicates the result of the logical operation performed between the bits included in the input bit string and of which another bit indicates the inverse of the logical operation result.

Specifically in the lookup table, as shown in FIG. 3, at the address represented by an 8-bit (N=8) string "00000000," there is stored data "01XXXXXX" (X may be indeterminate) of which the most significant bit (MSB) is "0" indicating the result of the exclusive-OR operation performed on the bit string "00000000" and of which the next most significant bit is "1" indicating the inverse of the logical operation result. At the address represented by a bit string "00000001," there is stored data "10XXXXXX" (X may be indeterminate) of which the most significant bit (MSB) is "1" indicating the result of the exclusive-OR operation performed on the bit string "00000001" and of which the next most significant bit is "0" indicating the inverse of the logical operation result.

In this example, the output section 13 receives the input of a 1-bit signal from the outside. The output section 13 reads from the data in the memory device 12 the data stored at the address represented by a bit string outputted from the input buffer section 11. Depending on whether the externally input 1-bit signal is "0" or "1," the output section 13 selectively outputs from the retrieved data either the bit indicating the result of the logical operation or the bit indicating the inverse of the logical operation result. In one example according to the embodiment, if the externally inputted 1-bit signal is "0," the output section 13 reads from the data in the memory device the data stored at the address represented by the bit string outputted from the input buffer section 11, and outputs the MSB from the retrieved data. If the externally input 1-bit data is "1," the output section 13 reads from the data in the memory device the data stored at the address represented by the bit string outputted from the input buffer section 11, and outputs the next MSB (the bit indicating the inverse of the logical operation result) from the retrieved data.

Figure 4:
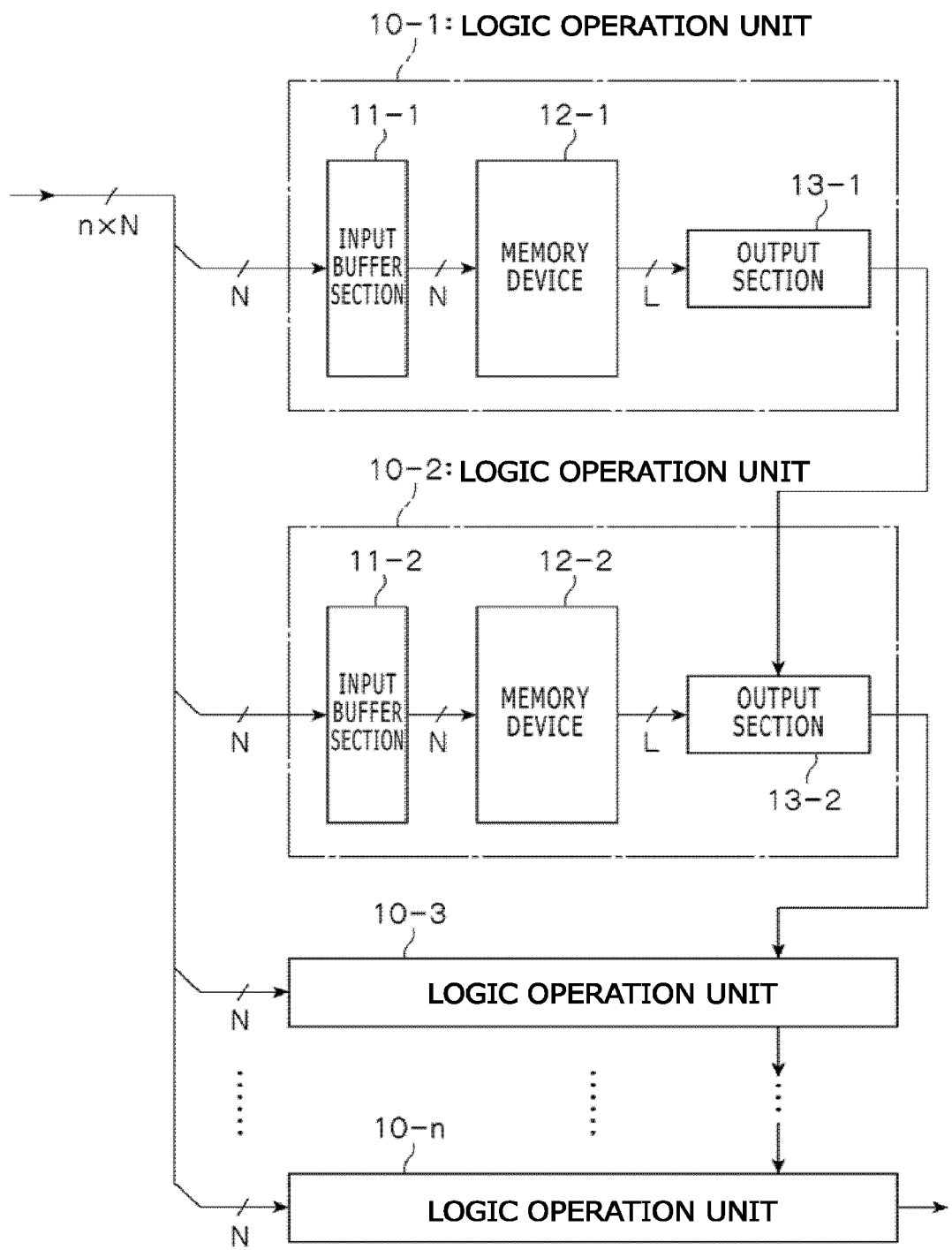
FIG. 4 is a block diagram showing a typical structure of a logic operation device as another embodiment of the present disclosure.

The embodiment of the present disclosure is basically structured as described above, and operates as explained below in connection with following examples. One example, as shown in FIG. 4, includes multiple arithmetic logic units 10_1, 10_2, . . . , and 10_n. An output section 13_i of an i-th logic operation unit 10_i receives the bit output from an (i−1)-th logic operation unit 10_i−1 as input from the outside. The output section 13_1 of the first arithmetic logic unit 10_1 does not receive input from the outside (or, is assumed to receive a fixed "0, " for example, from the outside); the output section 13_1 outputs the bit indicating the result of the logical operation (MSB in the above example) from among the data stored in the memory device 12.

Also in this example according to the present embodiment, what is received as input is data D that is 8×n bits long (i.e., address bus width of the memory device 12 is multiplied by an integer n; the i-th bit in the data D is referred to as bi (i=1, 2, . . . , 8n)) and subject to the exclusive-OR operation. The data D is outputted, in group of 8 bits (address bus width of the memory device 12) starting from the MSB (or the LSB), to the input buffer sections 11_1, 11_2, . . . , and 11_n of the arithmetic logic units 10_1, 10_2, . . . , and 10_n, respectively.

The output section 13_1 of the logic operation unit 10_1 reads from the data in the memory device 12_1 the data stored at the address represented by 8-bit string (b1, b2, . . . , b8) inputted to the input buffer 11_1. The output section 13_1 then outputs the bit indicating the result of the logical operation (here, the bit represents the result of the exclusive-OR operation performed on the input 8-bit string) from the retrieved data.

The output section 13_2 of the next arithmetic logic unit 10_2 reads from the data in the memory device 12_2 the data stored at the address represented by 8-bit string (b9, b10, . . . , b16) inputted to the input buffer 11_2. The output section 13_2 selectively outputs from the retrieved data either the bit indicating the result of the logical operation or the bit indicating the inverse of the logical operation result on the basis of the bit output from the output section 13_1 of the logic operation unit 10_1 of the immediately proceeding stage. Specifically, if the bit output from the output section 13_1 is "0," the output section 13_2 outputs from the retrieved data the bit indicating the result of the logical operation. If the bit output from the output section 13_1 is "1," the output section 13_2 outputs the bit indicating the inverse of the logical operation result.

Thereafter, the output section 13_i of the i-th logic operation unit 10_i reads from the data in the memory device 12_i the data stored at the address represented by 8-bit string (b8 (i−1)+1, b8 (i−1)+2, . . . , b8i) inputted to the input buffer 11_i. The output section 13_i selectively outputs from the retrieved data either the bit indicating the result of the logical operation or the bit indicating the inverse of the logical operation result on the basis of the bit output from the output section 13_i−1 of the upstream arithmetic logic unit 10_i−1. Specifically, if the bit outputted from the output section 13_i−1 is "0, " the output section 13_i outputs the bit indicating the result of the logical operation from the retrieved data. If the bit output from the output section 13_i−1 is "1, " the output section 13_i outputs the bit indicating the inverse of the logical operation result from the retrieved data.

Eventually, the output section 13_n of the n-th logic operation unit 10_n reads from the data in the memory device 12_n the data stored at the address represented by 8-bit string (b8 (n−1)+1, b8 (n−1)+2, . . . , b8n) inputted to the input buffer 11_n. The output section 13_n selectively outputs from the retrieved data either the bit indicating the result of the logical operation or the bit indicating the inverse of the logical operation result on the basis of the bit outputted from the output section 13_n−1 of the upstream arithmetic logic unit 10_n−1. Specifically, if the bit output from the output section 13_n−1 is "0," the output section 13_n outputs the bit indicating the result of the logical operation from the retrieved data. If the bit outputted from the output section 13_n−1 is "1," the output section 13_n outputs the bit indicating the inverse of the logical operation result from the retrieved data.

In this manner, the output section 13_n of the n-th logic operation unit 10_n outputs the result of the logical operation (exclusive-OR operation in this example) performed on the bits included in the data D of 8×n bits.

Figure 5:
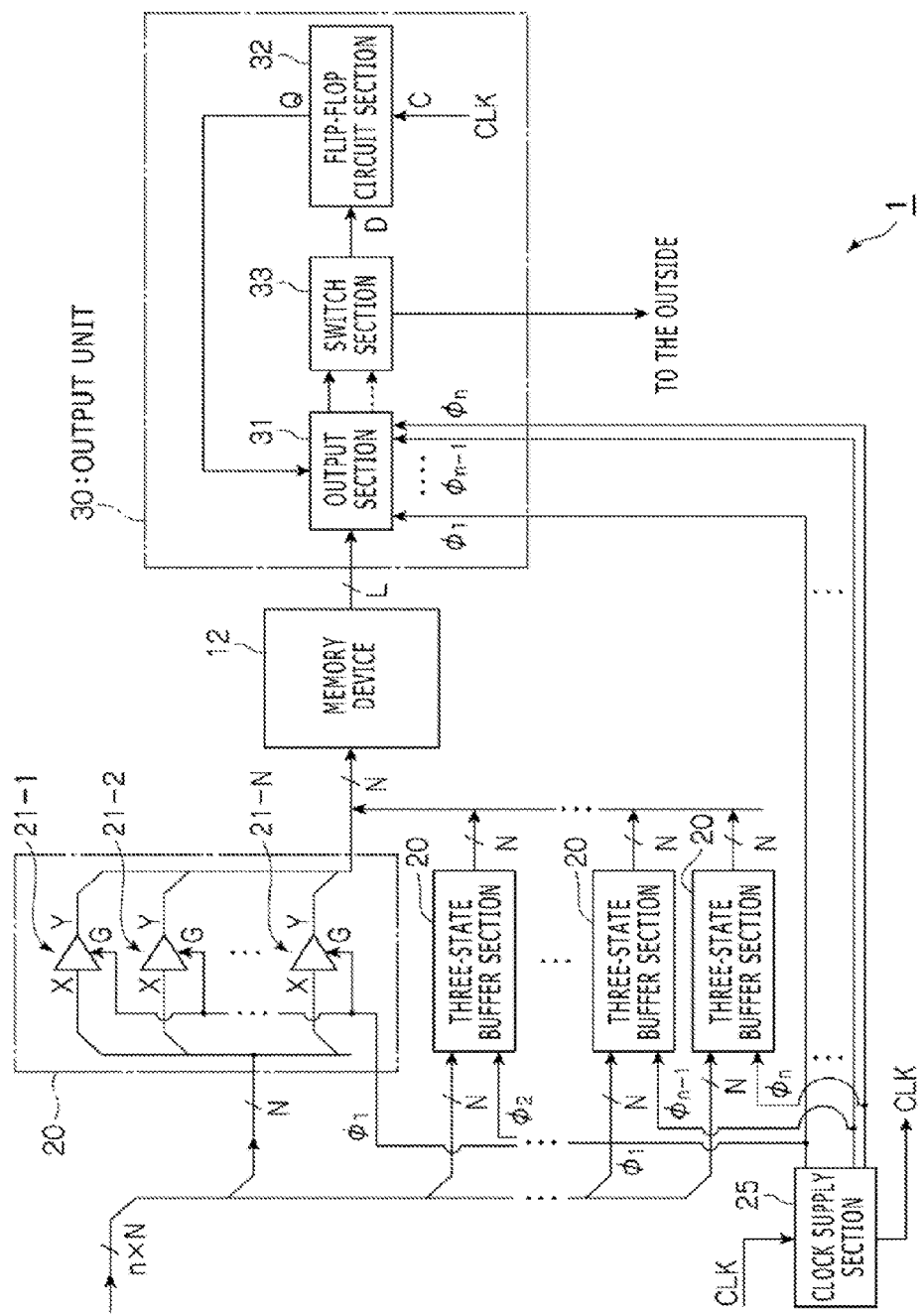
FIG. 5 is a block diagram showing a typical structure of a logic operation device as still another embodiment of the present disclosure.

Although the above examples involve the use of multiple logic operation units 10, i.e., the use of memory devices 12 arranged inparallel, the embodiments of the present disclosure are not limited thereby. In another embodiment according to the disclosure, the memory device 12 may be used on a time-sharing basis. A logic operation unit 1 according to the embodiment of the disclosure is structured to include, as shown in FIG. 5, n three-state buffer sections 20, a memory device 12, a clock supply section 25, and an output unit 30. Each three-state buffer section 20 includes N three-state buffers 21 (N=8 in this example). The output unit 30 includes an output section 31, a flip-flop circuit section 32, and a switch section 33. The components already explained above in conjunction with the preceding examples are designated by the same reference characters, and their explanations are omitted hereunder where redundant. In this example, the memory device 12 is assumed to store the data shown in FIG. 3.

Each three-state buffer 21 has an input terminal X, an output terminal Y, and a gate terminal G. As long as the input to the gate terminal G remains "0," the three-state buffer 21 holds the output terminal Y in a high-impedance state "Z" regardless of the input to the input terminal X. The three-state buffer 21, if its output terminal Y is brought into the high-impedance state, is in an insulated (i.e., disconnected) state when viewed from the destination to which the output terminal Y is connected.

In the embodiment of the disclosure, 8n three-state buffers 21 are divided into groups of eight, e.g., the first through the eighth three-state buffers 21_1 through 21_8 making up the first group, the ninth through the 16th three-state buffers 21_9 through 21_16 making up the second group, and so on. The gate terminals G of the three-state buffers 21 belonging to the same group are supplied with the same signal from the clock supply section 25. This signal will be discussed later in more detail. The bits in the data D that is 8×n bits long and subject to the logical operation are inputted successively starting from the MSB (or LSB) to the input terminal X_i of the i-th three-state buffer 21_i.

The output terminal Y_i of the i-th three-state buffer 21_i is connected to the (i mod 8)-th pin on the address bus of the memory device 12. In this context, (i mod k) means the remainder left over when i is divided by k.

Figure 6:
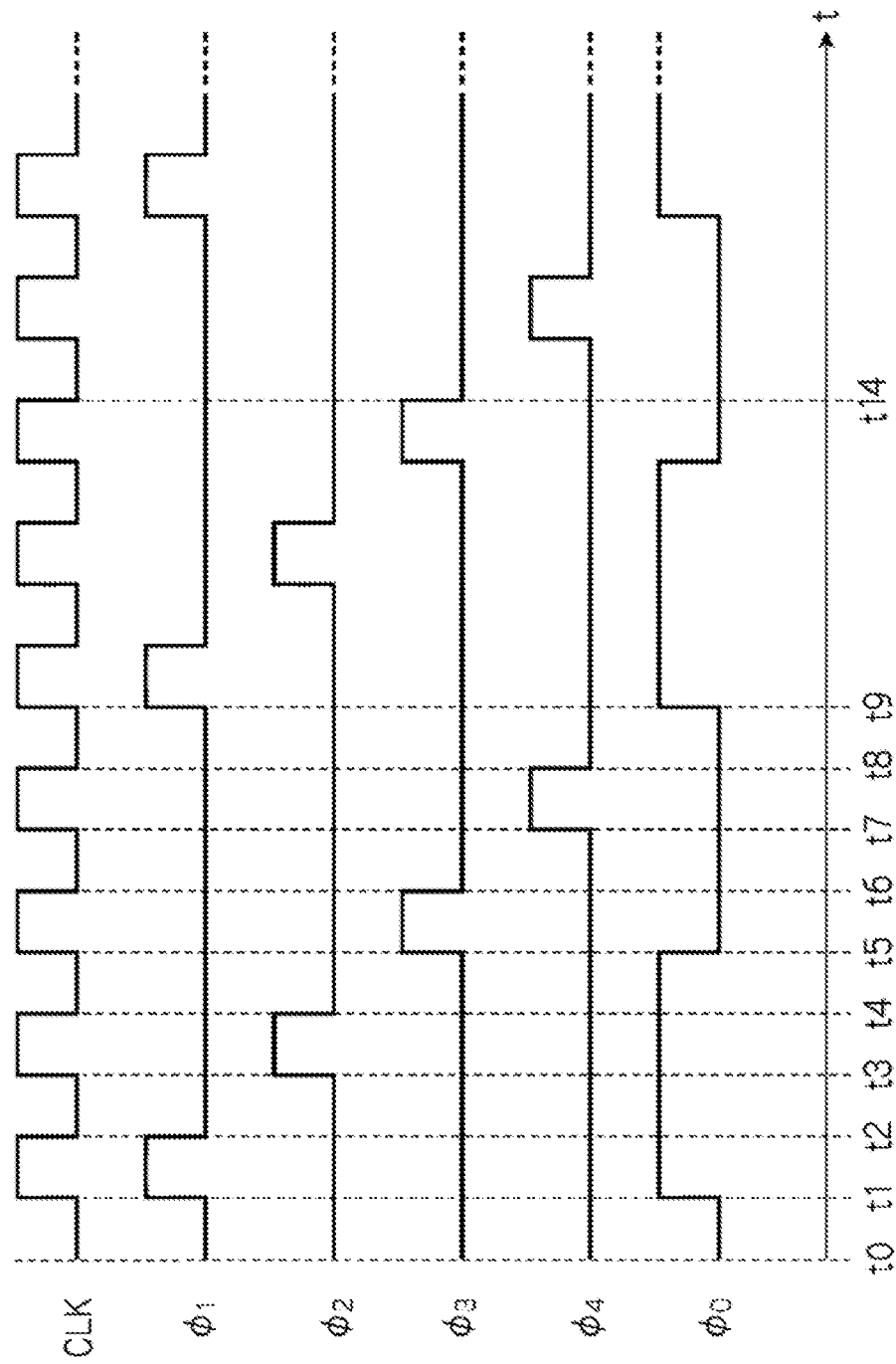
FIG. 6 is a timing chart showing typical signals output by a clock supply section of a logic operation device embodying the present disclosure.

As shown in FIG. 6, the clock supply section 25 generates and outputs a clock signal CLK that rises and falls in a periodically repeated manner. The clock supply section 25 also generates n sub clock signals φi (i=1, 2, . . . , n; n is the number given by dividing the number of bits 8n subject to the logical operation by the address bus width, i.e. 8, of the memory device 12). FIG. 6 shows sub clock signals φ1, φ2, φ3, and φ4 in effect when n=4, as well as a sub clock signal φ0.

The rising or falling timing of the sub clock signal φ1 is as follows. When the clock signal CLK rises for the j -th time after a given point in time (e.g., t2), the sub clock signal φi (i=(j mod n)+1) is caused to rise. When the clock signal CLK falls for the j -th time after t2, the sub clock signal φi (i=(j mod n)+1) is caused to fall . In this case, the sub clock signal φi (i≠(j mod n)+1) is held at the Low state.

In FIG. 6 (where n=4), for example, when the clock signal CLK rises (at t3) for the first time after the given point in time t2, the sub clock signal φ2 satisfying i=(1 mod 4)+1=2 rises. When the clock signal CLK falls (at t4) for the first time after the given time t2, the sub clock signal φ2 satisfying i=(1 mod 4)+1=2 falls.

The clock supply section 25 also generates the sub clock signal φ0 as follows. If (j mod n)=0 is satisfied when the clock signal CLK rises for the j-th time after the given time, the sub clock signal φ0 rises. The sub clock signal φ0 falls by the time the clock signal CLK rises for the n-th time, such as when the clock signal CLK rises for the n/2-th time or falls for the (n−1)/2-th time.

Specifically, in the example of FIG. 6, after the given time t2 when the clock signal CLK rises for the fourth time (at t9) (4 mod 4)=0 is satisfied. At this moment, the clock supply section 25 performs control to cause the sub clock signal φ0 to rise. Thereafter (past t9), the clock supply section 25 performs control to let the sub clock signal φ0 fall by the time the clock signal CLK falls for the (n/2+1)-th time or the ((n−1)/2+1)-th time (at t14; it is assumed here that n/2+1=3rd time). In the example of FIG. 6, the sub clock signal φ0 is controlled to fall when the clock signal CLK rises immediately before the clock signal CLK falls for the (n/2+1)-th time, i.e., for the third time, after time t9.

The clock supply section 25 supplies the sub clock signal φ1 to the first through the eighth three-state buffers 21_1 through 21_8, the sub clock signal φ2 to the ninth through the 16th three-state buffers 21_9 through 21_16, and so on, thus supplying the sub clock signal φ ([(p−1)/8]+1) to each of the eight three-state buffers 21_p (p is an integer of at least 1). Here, [*] means the largest integer not exceeding *.

The three-state buffers 21 and the clock supply section 25 working as described above implement bit conversion or time-shared extracting means that receives the input of a bit string of M bits (M is an integer larger than N), extracts an N-bit string from the input M-bit string, and outputs the extracted N-bit string to the memory device 12 on a time-sharing basis.

At the time the clock signal CLK from the clock supply section 25 falls while the sub clock signal φn (n is the number obtained by dividing the number of bits 8n subject to the logical operation by the address bus width 8 of the memory device 12) does not fall, the output section 31 of the output unit 30 receives the input of a 1-bit signal from the flip-flop circuit section 32 and holds the received signal in a buffer (not shown). The next time the clock signal CLK rises, the output section 31 reads from the data in the memory device 12 the data stored at the address represented by the bit string outputted from the three-state buffers 21. Depending on whether the 1-bit signal held in the buffer is "0" or "1," the output section 31 selectively outputs from the retrieved data either the bit indicating the result of the logical operation or the bit indicating the inverse of the logical operation result.

In one example according to the embodiment, if the bit held in the buffer is "0," the output section 31 outputs the MSB (bit indicating the result of the logical operation) from the data read from the memory device 12 to the switch section 33. If the bit held in the buffer is "1," the output section 31 outputs the next MSB (i.e., bit indicating the inverse of the logical operation result) from the data read from the memory device 12 to the switch action 33. The output section 31 continues the output until the clock signal CLK falls next time.

The output section 31 further controls the switch section 33, as is discussed later. Specifically, at the time the sub clock signal φn (n is the number obtained by dividing the number of bits 8n subject to the logical operation by the address bus width 8 of the memory device 12) from the clock supply section 25 rises, the output section 31 sets the destination of the output from the switch section 33, to be explained later, to the outside. The next time the clock signal CLK from the clock supply section 25 rises, the output section 31 sets the the destination of the output from the switch section 33 to the flip-flop circuit section 32.

Furthermore, at the time the sub clock signal φn from clock supply section 25 falls, the output section 31 holds the "0" bit in the buffer regardless of the output of the flip-flop circuit section 32. This operation is called the reset operation of the output section in the description that follows.

The flip-flop circuit section 32 is structured to include, for example, a D-type flip-flop circuit. Specifically, a D terminal (input terminal) of the flip-flop circuit 24 receives the output from the output section 31. The C terminal (clock terminal) of the flip-flop circuit 24 receives the input of the clock signal CLK from the clock supply section 25. At the time the clock signal CLK rises, the flip-flop circuit section 32 holds the bit inputted to the D terminal (input terminal) and outputs a signal representative of that bit to an output terminal Q. This output is continued even when the clock signal CLK falls. The bit outputted from the output terminal Q is inputted to the output section 31 as the output from the flip-flop circuit section 32.

Under control of the output section 31, the switch section 33 selectively outputs the 1-bit information from the output section 31 either to the flip-flop circuit section 32 or to the outside.

Explained below are the operation of a logic operation device 1 according to one embodiment of the present disclosure. It is assumed here that what is received is the input of data D of M=N×n bits (address bus width N of the memory device 12 is multiplied by an integer n; the i-th bit in the data D is bi (i=1, 2, ..., N×n)) subject to the exclusive-OR operation as a logical operation, for example. The i-th bit starting from the MSB (or LSB) is inputted successively to the i-th three-state buffer 21_i.

The logic operation device 1 works as follows: With the reset operation performed (at time t0 in FIG. 6), the output section 31 holds the "0" bit in the buffer. The next time the clock signal CLK from the clock supply section 25 rises (at time t1 in FIG. 6), the three-state buffers 21_1 through 21_8 feed the input bits b1, b2, ..., and b8 onto the address bus of the memory device 12.

From the data in the memory device 12, the output section 31 reads the data stored at the address represented by the bit string outputted from the three-state buffers 21_1 through 21_8. At this moment, the buffer of the output section 31 holds the "0" bit, so that the output section 31 outputs from the data retrieved from the memory device 12 the MSB (bit indicating the result of the logical operation) as a first-time operation result R1. The output R1 is sent to the flip-flop circuit section 32 via the switch section 33 and is held in the flip-flop circuit section 32.

Then, when the clock signal CLK from the clock supply section 25 falls (at time t2 in FIG. 6), the outputs from the three-state buffers 21_1 through 21_8 are in the high-impedance state. The output section 31 then receives the preceding operation result R1 from the flip-flop circuit 32 and holds it in the buffer.

When the clock signal CLK from the clock supply section 25 rises (at time t3 in FIG. 6), the three-state buffers 21_9 through 21_16 feed the input bits b9, b10, ..., and b16 onto the address bus of the memory device 12.

From the data in the memory device 12, the output section 31 reads the data stored at the address represented by the bit string composed of bits outputted from the three-state buffers 21_9 through 21_16. If the buffer holds a "0" bit (if the operation result R1 is "0"), the output section 31 outputs the MSB (bit indicating the result of the logical operation) as a second-time operation result R2, from among the data retrieved from the memory device 12. If the buffer holds a "1" bit (if the operation result R1 is "1"), the output section 31 outputs the next most significant bit (bit indicating the inverse of the logical operation result) as the second-time operation result R2, from among the data retrieved from the memory device 12. The output R2 is sent to the flip-flop circuit section 32 via the switch section 33 and is held in the flip-flop circuit section 32.

Thereafter, similar processes are performed. At the time the sub clock signal φn from the clock supply section 25 rises, the output section 31 sets the destination of the output from the switch section 33 to the outside. At this moment, the output section 31 reads the data stored at the address represented by the bit string composed of the bits outputted from three-state buffers 21_(8×(n−1)+1) through 21_(8n) in the memory device 12. If the buffer holds the "0" bit (if the operation result Rn−1 is "0"), the output section 31 outputs the MSB (bit indicating the result of the logical operation) as the operation result R, from among the data retrieved from the memory device 12. If the buffer holds the "1" bit (if the operation result Rn−1 is "1"), the output section 31 outputs the next MSB (bit indicating the inverse of the logical operation result) as the operation result R, from among the data retrieved from the memory device 12. This output is fed to the outside via the switch section 33.

Then, when the clock signal CLK falls, the output section 31 performs the reset operation. When the clock signal CLK rises next, the output section 31 sets the flip-flop circuit section 32 as the destination to which the output of the switch section 33 is directed.

In the embodiment described above, every time the N-bit string is outputted on a time-sharing basis, the output section 31 functions as the means to selectively output either the bit indicating the result of the logical operation performed between the bits retrieved by accessing the memory device using the previously outputted bits, or the bit indicating the inverse of the logical operation result.

The n-th time around, the output section 31 outputs as the operation result R the result of the logical operation (exclusive-OR operation in this example) performed on the bits included in the data D of 8×n bits.

An example of the output unit where the logical operation is performed on a time-sharing basis is not limited to that disclosed above. Since each address in the memory device 12 accommodates 8-bit data, there maybe provided alternatively another output device by making effective use of the 8-bit width, as explained below.

Figure 7:
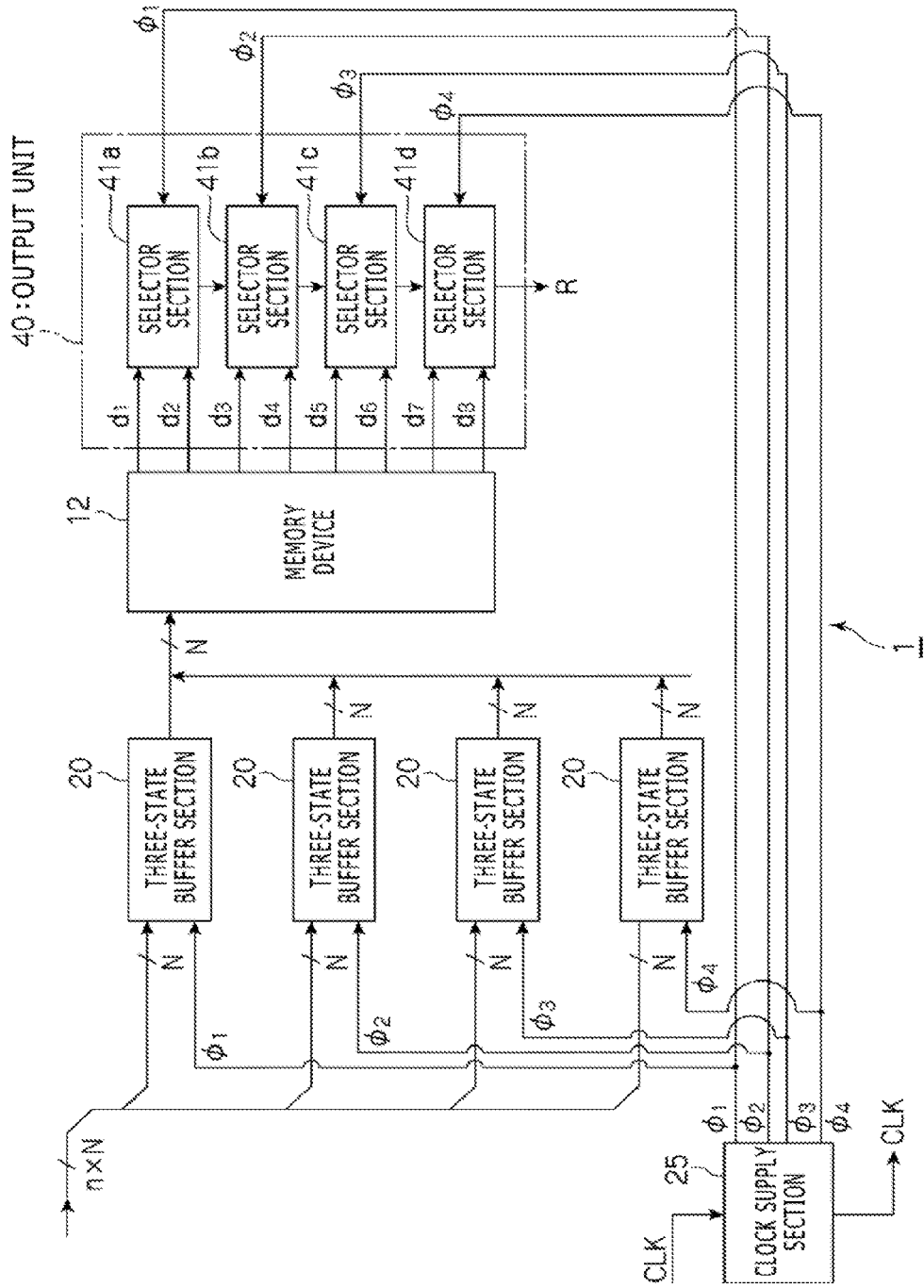
FIG. 7 is a block diagram showing a typical structure of a logic operation device as still another embodiment of the present disclosure.

An arithmetic logic unit 1 according to still another embodiment of the present disclosure is structured to include, as shown in FIG. 7, 8×n (address bus width N=8 for the memory device 12) three-state buffers 21 (as in the example of FIG. 5, each three-state buffer section 20 is formed by a groups of 8 three-state buffers), a memory device 12, a clock supply section 25, and an output unit 40. The output unit 40 is structured to include four selector sections 41a, 41b, 41c, and 41d (number 4 represents half of the data bus width L of the memory device 12). The components already explained above in conjunction with the preceding examples are designated by the same reference characters, and their explanations are omitted hereunder where redundant.

Figures 8, 9:
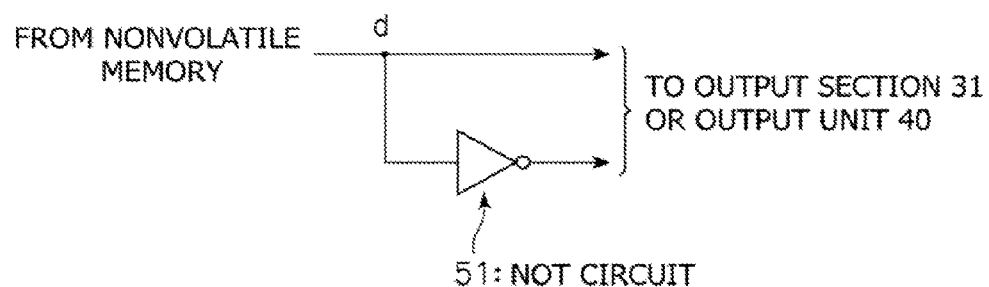
FIG. 8 is an explanatory diagram showing still another example of the content of the lookup table as part of a logic operation device embodying the present disclosure.
FIG. 9 is an explanatory diagram showing a typical circuit in the output stage of a logic operation device embodying the present disclosure.

In the memory device 12 of this example, as shown in FIG. 8, combinations of the result of the logical operation based on the bit string a1, a2, . . . , and a8 with the bit indicating the inverse of the logical operation result are arranged repeatedly at locations each represented by an 8-bit address A (represented by the bit string a1, a2, . . . , and a8). That is, in this example, the result of the logical operation is stored in each odd-numbered bit position of the data stored at each address location, and the inverse of the logical operation result is stored in each even-numbered bit position of the data thus stored.

The selector section 41a in the output unit 40 is connected with a signal line d1 representative of the MSB and with a signal line d2 representative of the next MSB, out of the signal lines making up the data bus of the memory device 12. The selector section 41a also receives an externally inputted 1-bit signal.

At the time the sub clock signal φ1 from the clock supply section 25 rises, the selector section 41a reads the data, stored at the address represented by the bit string output from the three-state buffers 21 from among the data in the memory device 12, and latches the retrieved data. Depending on whether the externally inputted 1-bit signal is "0" or "1," the selector section 41a selectively latches from the retrieved data either the MSB (1 bit) indicating the result of the logical operation or the next MSB indicating the inverse of the logical operation result, and outputs the latched bit.

In this example, if the externally inputted bit is "0," the selector section 41a selectively latches the MSB (indicating the result of the logical operation, output through the signal line d1) from among the data retrieved from the memory device 12 and outputs the latched bit. If the externally inputted bit is "1," the selector section 41a selectively latches the next MSB (outputted through the signal line d2, indicating the inverse of the logical operation result) from among the data retrieved from the memory device 12 and outputs the latched bit.

The selector section 41b is connected with a signal line d3 nearer to the MSB and with a signal line d4 that is the next bit, the signal lines making up the data bus of the memory device 12. The selector section 41b also receives the 1-bit signal from the selector section 41a.

At the time the sub clock signal φ2 inputted from the clock supply section 25 rises, the selector section 41b reads the data stored at the address represented by the bit string outputted from the three-state buffers 21 in the memory device 12, and latches the retrieved data. Depending on whether the 1-bit signal received from the selector section 41a is "0" or "1," the selector section 41b selectively latches from the retrieved data either the MSB-side bit indicating the result of the logical operation or the next bit indicating the inverse of the logical operation result, and outputs the latched bit.

In this example, if the bit received from the selector section 41a is "0," the selector section 41b selectively latches the MSB-side bit (indicating the result of the logical operation, outputted through the signal line d3) from among the data retrieved from the memory device 12 and outputs the latched bit. If the bit received from the selector section 41a is "1," the selector section 41b selectively latches from the data retrieved from the memory device 12 the bit through the signal line d4 next to the signal line d3 (the bit indicating the inverse of the logical operation result) and outputs the latched bit.

The selector section 41c is connected with a signal line d5 nearer to the MSB and with a signal line d6 that is the next bit, out of the signal lines making up the data bus of the memory device 12. The selector section 41c also receives the 1-bit signal outputted from the selector section 41b.

At the time the sub clock signal φ3 from the clock supply section 25 rises, the selector section 41c reads the data stored at the address represented by the bit string outputted from the three-state buffers 21 in the memory device 12, and latches the retrieved data. If the bit received from the selector section 41b is "0," the selector section 41c of this example selectively latches the MSB-side bit (indicating the result of the logical operation, output through the signal line d5) from among the data retrieved from the memory device 12, and outputs the latched bit. If the bit received from the selector section 41b is "1," the selector section 41c selectively latches from the data retrieved from the memory device 12 the bit represented through the signal line d6 next to the signal line d5 (the bit indicating the inverse of the logical operation result), and outputs the latched bit.

The selector section 41d is connected with a signal line d7 on the side of the MSB and with a signal line d8 that is the next bit, out of the signal lines making up the data bus of the memory device 12. The selector section 41d further receives the 1-bit signal from the selector section 41c.

At the time the sub clock signal φ4 from the clock supply section 25 rises, the selector section 41d reads the data stored at the address represented by the bit string outputted from the three-state buffers 21 in the memory device 12, and latches the retrieved data. If the bit received from the selector section 41c is "0," the selector section 41d of this example selectively latches the MSB-side bit (indicating the result of the logical operation, outputted through the signal line d7) from among the data retrieved from the memory device 12, and outputs the latched bit. If the bit received from the selector section 41b is "1," the selector section 41c selectively latches from among the data retrieved from the memory device 12 the bit represented through the signal line d8 next to the signal line d7 (the bit indicating the inverse of the logical operation result), and outputs the latched bit. The output of the selector section 41d is outputted to the outside.

The operation of the logic operation device 1 according to the embodiment is explained below. It is assumed here that what is received is the input of data D of M (=N×n) bits (address bus width N of the memory device 12 is multiplied by an integer n; the i-th bit in the data D is referred to as bi (i=1, 2, . . . , N×n)) subject to the exclusive-OR operation as the logical operation, for example. The i-th bit counted from the MSB (or LSB) is input successively to the i-th three-state buffer 21_i.

The logic operation device 1 works as follows. After the output of the selector section 41d has been delivered(at time t0 in FIG. 6), and then when the next time the clock signal CLK and the sub clock signal φ1 from the clock supply section 25 rise (at time t1 in FIG. 6), the three-state buffers 21_1 through 21_8 feed the input bits b1, b2, . . . , and b8 onto the address bus of the memory device 12.

At this moment, the selector section 41a in the output unit 40 reads the data stored at the address represented by the bit string composed of the bits outputted respectively from the three-state buffers 21_1 through 21_8 in the memory device 12. It is assumed that a "0" signal is being inputted to the selector section 41a from the outside. The selector section 41a has a latch that latches the MSB (data outputted though the signal line d1 of the data bus, indicating the result of the logical operation) from among the data retrieved from the memory device 12 as an operation result R1, and outputs the latched result R1 at the time the sub clock signal φ1 rises (at time t1 in FIG. 6). The output R1 is sent to the selector section 41b.

The selector section 41b receives the output R1. Then when the clock signal CLK and the sub clock signal φ2 from the clock supply section 25 rise (at time t3 in FIG. 6), the three-state buffers 21_9 through 21_16 feed the input bits b9, b10, . . . , and b16 onto the address bus of the memory device 12.

The selector section 41b reads the data stored at the address represented by the bit string composed of bits respectively outputted from the three-state buffers 21_9 through 21_16 in the memory device 12. If the bit received from the selector section 41a is "0" (i.e., if the operation result R1 is "0"), the selector section 41b latches the MSB-side bit (outputted through the signal line d3 of the data bus, indicating the result of the logical operation) as an operation result R2 at the time the sub clock signal φ2 rises (at time t3 in FIG. 6) from among the data retrieved from the memory device 12, and outputs the latched result R2. If the bit input from the selector section 41a is "1" (i .e. , if the operation result R1 is "1"), the selector section 41b latches from the data retrieved from the memory device 12 the bit outputted through the signal line d4 (i.e. the bit indicating the inverse of the logical operation result) as the operation result R2 at the time the sub clock signal φ2 rises (at time t3 in FIG. 6), and outputs the latched result R2. The output R2 is received by the selector section 41c.

The subsequent selector sections 41c . . . operate in like manner. At the time the sub clock signal φ4 rises, the three-state buffers 21_25 through 21_32 feed the inputted bits b25, b26, . . . , and b32 onto the address bus of the memory device 12. This causes the selector section 41d to read the data stored at the address represented by the bit string composed of the bits outputted respectively from the three-state buffers 21_25 through 21_32 in the memory device 12.

If the bit input from the selector section 41c is "0" (i.e., if the operation result R3 is "0"), the selector section 41d latches the MSB-side bit (output though the signal line d7 of the data bus, indicating the result of the logical operation) of the data retrieved from the memory device 12 as the operation result R at the time the sub clock signal φ4 rises, and outputs the latched result R. If the bit input from the selector section 41c is "1" (if the operation result R3 is "1"), the selector section 41d latches from the data retrieved from the memory device 12 the output through the signal line d8 (i.e. the bit indicating the inverse of the logical operation result) as the operation result R at the time the sub clock signal φ4 rises, and outputs the latched result R.

In the embodiment described above, when the N-bit string is output on a time-sharing basis, each selector section 41 in the output unit 40 functions as the means to selectively output either the bit indicating the result of the logical operation performed between the bits retrieved by accessing the memory device using the previously output bits, or the bit indicating the inverse of the logical operation result. Every four cycles of this time-sharing, the output unit 40 outputs as the operation result R the result of the logical operation (exclusive-OR operation in this example) performed on each of the bits in the data D of 32 bits (=8×4).

In this manner, when the N-bit string is output on a time-sharing basis, the output unit 40 of the embodiment functions as the means to selectively output either the bit indicating the result of the logical operation performed between the bits retrieved by accessing the memory device using the previously output bits, or the bit indicating the inverse of the logical operation result.

In the above description of the embodiments, where the lookup table in FIG. 3 is used, the output section 31 or the output unit 40 is shown to switch between the output of either an odd-numbered bit or an even-numbered bit in the data retrieved from the memory device 12 using the output from the previous stage. However, this concept does not limit the scope of the present disclosure. For example, as shown in FIG. 9, an inverting (NOT) circuit 51 may be connected with a signal line d (on which is outputted the logical operation result using the bit string represented by the address input to the memory device 12) output from the memory device 12, so as to obtain the bit indicating the inverse of the logical operation result using the bit string represented by the address inputted to the memory device 12. In this case, the output section 31 or the output unit 40 selects either the output of the signal line d or that of the NOT circuit 51 (the output unit 40 latches the output) using the output from the previous stage, and outputs what is selected.

In the logic operation device 1 embodying the present disclosure as shown in FIG. 4, 5, or 7, what is received is the input of a bit string having the length of the address bus width N of the memory device multiplied by an integer n (e.g., 32 bits long if the address bus width is 8 bits and the integer n is 4), and the result of the logical operation performed on the input bit string is the output of a single bit. In that case, eight such arithmetic logic devices 1 may be connected in parallel to have their outputs inputted to an 8-input logical operation circuit, whereby the logical operation on N×n×8 bits may be carried out.

Figure 10:
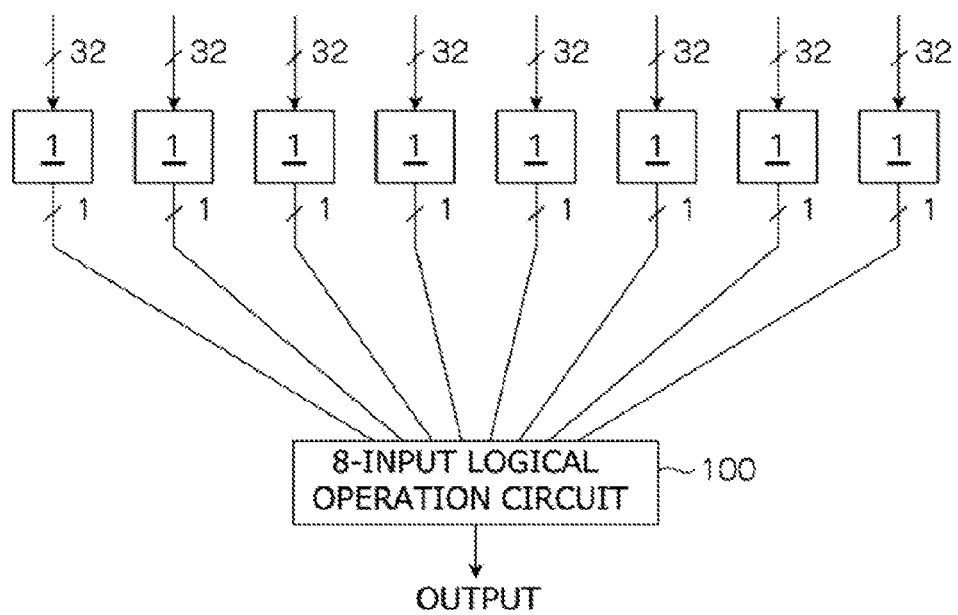
FIG. 10 is an explanatory diagram showing a device that performs a logical operation on bit strings each made up of more bits by use of a logic operation device embodying the present disclosure.

Specifically, FIG. 10 shows a setup having eight logic operation devices 1 connected in parallel, each logic operation device 1 being the one illustrated in FIG. 4, 5, or 7 and having the lookup table established in the memory device 12 in such a manner that given the input of a bit string of 32 bits (8 bits of the address bus width multiplied by n=4), the exclusive-OR operation is performed on the input bit string.

Figure 11:
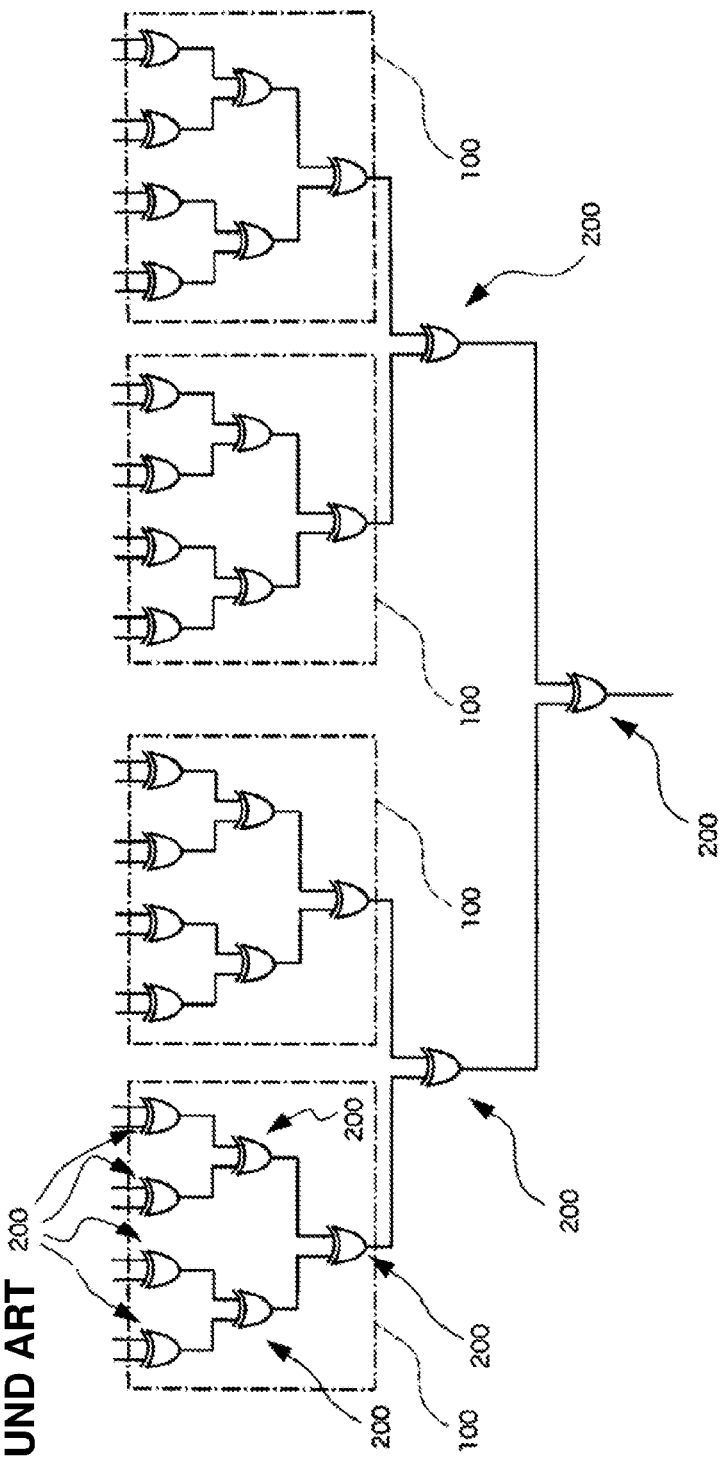
FIG. 11 is an explanatory diagram showing a logic operation device known in the art which performs the exclusive-OR operation on data 32 bits long.

In the example of FIG. 10, the 1-bit output from each logic operation device 1 is input to the 8-input XOR circuit 100, the same as the one shown in FIG. 11, whereby the exclusive-OR operation is performed on the bits to obtain one bit indicating the result of the exclusive-OR operation. According to this circuit structure, a circuit of relatively small scale still enables the exclusive-OR operation to be performed between the bits in the bit string of 256 bits (=8×4×8).

REFERENCE SIGNS LIST

1 Logic operation device, 10 logic operation unit, 11 Input buffer section, 12 Memory device, 13, 31 Output section, 20 Three-state buffer section, 21 Three-state buffer, 25 Clock supply section, 30, 40 Output unit, 32 Flip-flop circuit section, 33 Switch section, 41 Selector section, 51 NOT circuit, 100 8-input XOR circuit, 200 2-input XOR circuit.

The invention claimed is:

1. A logic operation device comprising:
a memory configured to receive an input of a N-bit long bit string and to store a lookup table, N being an integer of at least 2, the lookup table storing multiple-bit long data in an address represented by the N-bit long bit string, and a bit representative of a result of a logical operation performed between bits included in the N-bit long bit string being stored in a part of the multiple-bit long data; and
output circuitry configured to access the memory and output a bit included in the multiple-bit long data stored at the address represented by the N-bit long bit string, wherein
the multiple-bit long data stored in the memory includes the bit representative of the result of the logical operation performed between the bits in the N-bit long bit string and a bit indicating an inverse of the result of the logical operation,
the output circuitry selectively outputs either the bit representative of the result of the logical operation performed between the bits in the N-bit long bit string or the bit indicating the inverse of the result of the logical operation,
the logic operation device further comprises:
dividing circuitry configured to receive an input of a bit string M bits long, M being an integer larger than N; and
time-shared extracting circuitry configured to extract an N-bit string from the M-bit string to output the extracted N-bit string to the memory on a time-sharing basis, and
at a time the N-bit string is output on the time-sharing basis, the output circuitry selectively outputs either the bit representative of the result of the logical operation performed between the bits retrieved by accessing the memory using previously output bits, or the bit indicating the inverse of the result of the logical operation.

2. The logic operation device according to claim 1, wherein the result of the logical operation stored in the memory is a result of an exclusive-OR operation performed between the bits included in the N-bit long bit string.

3. The logic operation device according to claim 1, wherein the bit representative of the result of the logical operation performed between the bits included in the N-bit long bit string is a most significant bit of the multiple-bit long data.

4. The logic operation device according to claim 1, wherein most significant bits of the multiple-bit long data include the bit representative of the result of the logical operation performed between the bits included in the N-bit long bit string and a bit indicating an inverse of the result of the logical operation.

5. A logic operation method comprising:
receiving an input of a N-bit long bit string;
storing, in a memory, a lookup table, N being an integer of at least 2, the lookup table storing multiple-bit long data in an address represented by the N-bit long bit string, and a bit representative of a result of a logical operation performed between bits included in the N-bit long bit string being stored in a part of the multiple-bit long data;
accessing the memory; and
outputting, using output circuitry a bit included in the multiple-bit long data stored at the address represented by the N-bit long bit string, wherein
the multiple-bit long data stored in the memory includes the bit representative of the result of the logical operation performed between the bits in the N-bit long bit string and a bit indicating an inverse of the result of the logical operation, and
the method further comprises:
selectively outputting, using the output circuitry, either the bit representative of the result of the logical operation performed between the bits in the N-bit long bit string or the bit indicating the inverse of the result of the logical operation;
receiving, using dividing circuitry, an input of a bit string M bits long, M being an integer larger than N;
extracting, using time-shared extracting circuitry, an N-bit string from the M-bit string to output the extracted N-bit string to the memory on a time-sharing basis; and
at a time the N-bit string is output on the time-sharing basis, selectively outputting, using the output circuitry, either the bit representative of the result of the logical operation performed between the bits retrieved by accessing the memory using previously output bits, or the bit indicating the inverse of the result of the logical operation.

6. The logic operation method according to claim 5, wherein the result of the logical operation stored in the memory is a result of an exclusive-OR operation performed between the bits included in the N-bit long bit string.

7. The logic operation method according to claim 5, wherein the bit representative of the result of the logical operation performed between the bits included in the N-bit long bit string is a most significant bit of the multiple-bit long data.

8. The logic operation method according to claim 5, wherein most significant bits of the multiple-bit long data include the bit representative of the result of the logical operation performed between the bits included in the N-bit long bit string and a bit indicating an inverse of the result of the logical operation.

* * * * *